United States Patent [19]

Sawyer

[11] 4,198,597
[45] Apr. 15, 1980

[54] NEGATIVE CELL DETECTOR FOR A MULTI-CELL FUEL CELL STACK

[75] Inventor: Richard D. Sawyer, Canton, Conn.

[73] Assignee: United Technologies Corporation, Hartford, Conn.

[21] Appl. No.: 936,278

[22] Filed: Aug. 23, 1978

[51] Int. Cl.² ............................................. G01N 27/42
[52] U.S. Cl. .................................. 324/434; 340/636; 324/133
[58] Field of Search .............. 324/133, 29.5, 29, 30 R; 320/48; 340/636

[56] References Cited

U.S. PATENT DOCUMENTS

| | | | |
|---|---|---|---|
| 2,621,231 | 12/1952 | Medlar et al. | 340/636 |
| 3,500,372 | 3/1970 | Thiele | 340/636 |
| 3,515,983 | 6/1970 | Lante | 324/29.5 |
| 3,534,354 | 10/1970 | Galginaitis | 340/636 |
| 3,586,962 | 6/1971 | Rebstock | 324/29.5 |
| 3,796,951 | 3/1974 | Joseph | 324/133 |
| 3,872,457 | 3/1975 | Ray | 340/636 |
| 3,942,104 | 3/1976 | Byrne | 324/30 R |

Primary Examiner—M. Tokar
Attorney, Agent, or Firm—Richard P. Lange

[57] ABSTRACT

A detector for sensing defective cells among a plurality of voltage producing cells which together form a source of DC electrical power. A series of light emitting diodes are coupled to the positive and negative junctions of each voltage producing cell so that they are biased to a nonconducting state so long as the cell has a positive output voltage. In the event that a cell becomes defective causing its voltage output to drop, the voltage produced by the remaining cells create a load current by which the defective cell goes negative and forward biases the corresponding light emitting diode. In turn, the light emitting diode changes to its conducting state whereupon it emits light and identifies the defective cell.

5 Claims, 3 Drawing Figures

NEGATIVE CELL DETECTOR FOR A MULTI-CELL FUEL CELL STACK

BACKGROUND OF THE INVENTION

1. Field of the Invention

This invention relates to a detector for sensing one or more negative cells in a multicelled module and, more particularly, to a simple low cost detector apparatus for continuously monitoring each voltage producing cell of a module in fuel cells to identify faulty or inoperative cells.

2. Description of the Prior Art

It is generally known that one reliable method of detecting one or more bad voltage producing cells in a stack of cells is by means of measuring the voltage level of the cells. If the voltage level of all the cells are approximately at the same potential or within a relatively small range, the individual cells are normally in good condition. When an individual cell begins to deteriorate, as a result of age or other conditions, it most often will exhibit a lower voltage as compared with good cells; and, in the worst case condition, the voltage output of the cell drops to zero. A totally inoperative cell still connected in series with the remaining cells of a multi-stacked fuel cell is a particular problem because, in addition to having no output voltage, its internal impedance normally increases and actually causes a voltage drop across the cell during load conditions. The current forced through the faulty cell by the remaining cells of the stack causes power to be dissipated in the form of heat. This heat is conducted to the cells adjacent to the bad cell and can create over-temperature conditions which will reduce the operating life of the adjacent cells.

Heretofore, one commonly used method of checking for faulty cells has been to test cells individually with a volt meter. The volt meter is connected in succession to the terminals of each voltage producing cell and the voltage level noted. Of course, with multi-stacked fuel cell modules, the volt meter could be connected across all of the cells in series to determine if the overall voltage were low; however, it would still be necessary to individually test the cells to determine which specific cell were faulty.

The automated interrogation of the terminals from each of the cells in a mult-celled stack to determine voltage levels is also generally known. Numerous different kinds of automated interrogation devices are available which are suitable for sensing the voltage level at a plurality of terminals, and if desired comparing the sensed voltage level to a predetermined reference. The results can then be read out on an analog or digital gage, or used as an input signal in a complex control system for the fuel cell itself.

Many different types of test apparatus are also known for sensing the voltage level of battery storage cells. For example, U.S. Pat. No. 2,621,231 issued Dec. 9, 1952 to L. Medlar et al describes a resistive type tester for detecting bad or weak cells of a multi-celled battery. Each of the plurality of series connected resistors is also coupled across one cell of the battery. By measuring the current flow in the leads coupling a resistor to its corresponding cell which is proportional to the voltage output of that cell, a signal indicating the voltage level and hence the health of the cell is derived. A particular problem with the technique employed by the Medlar et al patent is that the series-connected resistors draw some current at all times and thus consume power which would otherwise be available to the load. In addition, this technique is not completely usable for fuel cells, because it is common in a fuel cell to have certain voltage producing cells with a higher voltage output level in normal operation compared with other cells depending on a number of variables such as age, location in the stack, etc. Thus, if fixed resistors were to be used in the manner disclosed by Medlar et al, such resistor/voltage level mismatches can cause circulating currents which introduce a significant sensing error.

SUMMARY OF THE INVENTION

The primary object of the present invention is to provide a detector for sensing negative or defective fuel cells in a multi-celled power source.

A particular advantage of a detector according to the present invention is that it can be used to monitor cells whose voltage levels may be hundreds of volts above ground potential and yet is electrically isolated so that it does not create a safety hazard to the plant facilities or operating personnel.

Another advantage of the detector according to the present invention is that it can be used to continuously monitor all the cells in a multi-celled power source to sense negative or non-voltage producing cells but yet it will only draw power when a particular cell is faulty.

Still another advantage of a detector according to the present invention is that it independently monitors each cell of a multi-celled power source for negative cells in a manner that any inherent voltage variation of the cells in the stack, such as the top cells being low in voltage and the bottom cells being high in voltage, will not provide an erroneous fault indication.

Other objects, features and advantages of the present invention will become more apparent in the light of the following detailed description of the illustrated embodiment, as shown in the accompanying drawing.

DETAILED DESCRIPTION OF THE ILLUSTRATED EMBODIMENT

Figure 1:
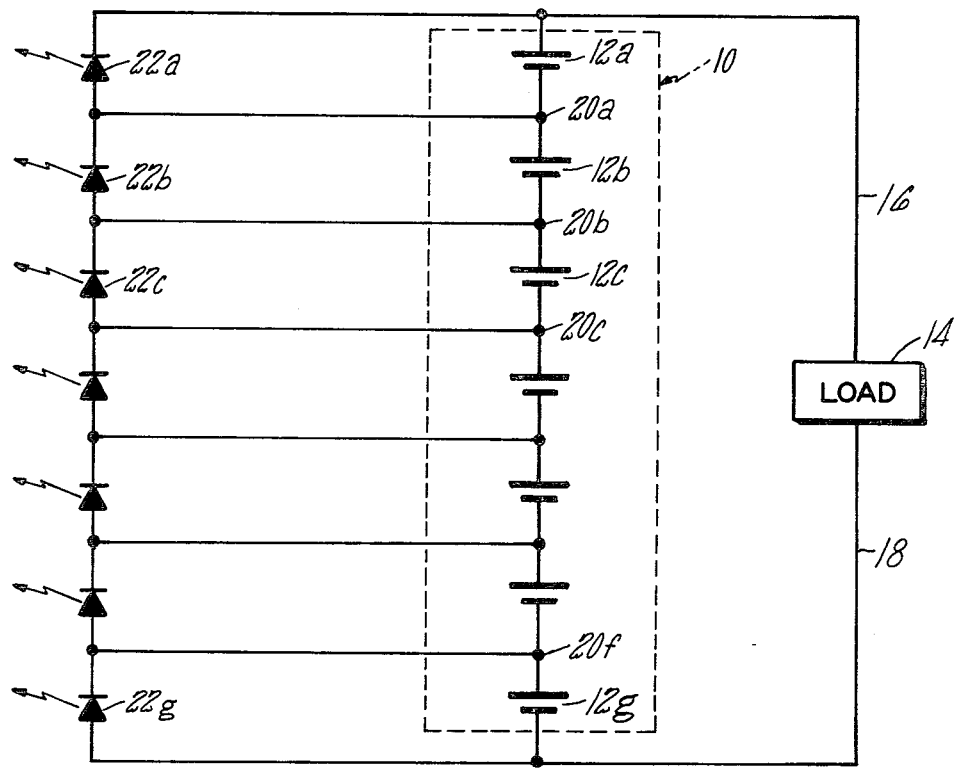
FIG. 1 is a schematic diagram of an embodiment of the present invention together with a DC power source such as a fuel cell.

Referring initially to FIG. 1, a DC power source 10, such as a fuel cell or the like, is comprised of a number of individual cells 12a, 12b, 12c, . . . 12g which are connected in series so that the effective output voltage of the DC power source 10 is equal to the sum of the voltage potentials of the individual cells 12a–12g. The DC power source 10 is connected to a load 14 by leads 16 and 18, such as an inverter or other DC power consuming device. As is seen in the drawing, the junction points 20a, 20b, . . . 20f are located at the interconnection of the adjacent individual voltage producing cells.

According to the present invention, a unidirectional photo-emissive device, such as a LED (light emitting diode) 22a, 22b, 22c, . . . 22g, is connected across each individual fuel cell 12a, 12b, etc in a reverse bias direction so that the cathode of each LED 22 is connected to the positive side of each voltage producing cell 12 and the anode of each LED 22 is connected to the negative side of each voltage producing cell 12. Accordingly, it is apparent that, for example, so long as the cell 12a individually has a positive voltage output, the LED 22a is biased to its non-conducting state.

Assume now that for some reason individual cell 12b becomes faulty or defective, and thus its voltage drops to zero. Under no-load conditions where the current out of the power source 10 is zero, the voltage potential at junctions 20a and 20b is approximately the same. However, because of the series connection of all of the cells in the DC power source during load conditions, all of the current to the load 14 passes through cell 12b causing a positive-to-negative voltage from junction point 20b to junction point 20a. This voltage is sufficient to bias the LED 22b into its conducting state causing it to emit light which indicates that cell 12b is defective. As is apparent, so long as the cell 12b has some positive voltage output, the LED 22b is reversed biased and thus it is nonconductive so that no power is consumed until the cell 12b goes negative. In addition, it will be appreciated that the parameters of the LED's 22 need not be matched to the characteristics of the individual cells 12. This allows the use of a single type of LED manufactured with a wide tolerance band, or different types of LED's can be intermixed in the series combination without effecting the operation of the detector. However, since it is common to have the impedance of an individual cell progressively increase as the cell becomes faulty, the impedance of the diode must be selected to keep the current through the diode within an acceptable range, or alternatively a resistor can be placed in series with one or more of each LED 22 to reduce the current flow during a fault condition.

Figure 2:
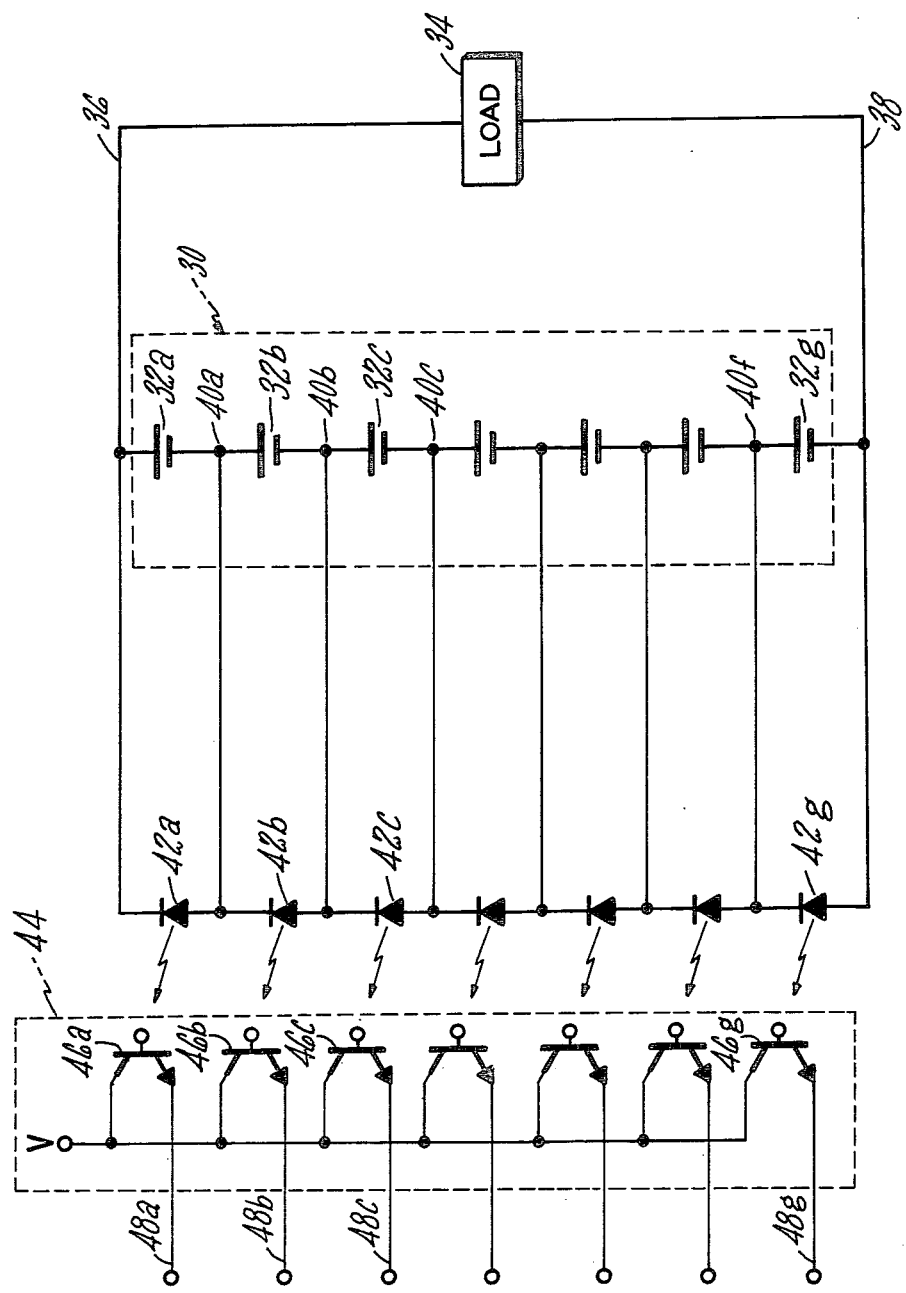
FIG. 2 is a schematic diagram of an embodiment according to the present invention with supplemental photoresponsive switching devices.

Referring next to FIG. 2, there is seen another embodiment of the present invention which is suitable for automatic interrogation. As before, a DC power source 30, such as a fuel cell, is comprised of a number of individual voltage producing cells 32a, 32b, 32c, . . . 32g which are connected in series so that the effective output voltage is equal to the sum of the DC potentials of the individual cells. The DC power source 30 is connected to a load 34 by lead 36 and 38 to which power is supplied. The junction points 40a, 40b, . . . 40f between the cells 32 have connected thereto a unidirectional photo-emissive device, such as a LED 42a, 42b, 42c, . . . 42g. A photoswitch 44, comprised of a plurality of light responsive devices, such as phototransistor 46, is positioned to receive the light emitted from each LED 42. The phototransistors 46 have one terminal coupled to a source of reference potential while it is disposed to receive light from the LED's 42 thereby causing a change to the conducting state. Each phototransistor 46 has a corresponding output lead 48 which can be connected to an analog or digital gage, or to an automatic interrogation device such as a microprocessor which senses the voltage level thereon.

As before, assume that for some reason the individual cell 32b becomes faulty or defective and its output voltage drops to zero. Under no-load conditions where the current out of the power source 30 is zero, the voltage potential at junctions 40a and 40b is approximately the same. However, because all of the cells 32 are connected in series in the DC power source 30 during load conditions, all of the current provided by the DC power source 30 to the load 34 passes through the cell 42 causing a positive-to-negative voltage from the junction 40b to the junction 40a. This voltage is sufficient to bias the LED 42 into its conducting state causing it to emit light. The phototransistor 46c of the photoswitch 44 is positioned until it receives the light radiated from the photodiode 40c and is in turn rendered conductive. Accordingly, the voltage level on line 48c raises to that of the reference potential V thus indicating upon interrogation that individual cell 32c is defective.

If desired, the photoresponsive device 44 need not include a phototransistor 46 which responds to the light emitted from a single LED 42. For example, the photoresponsive device could include a lesser number of phototransistors or even a single phototransistor 46 which is positioned to receive light emitted from all of the LED's 42. In the event that a fault indication were received, the operator would know that one or more of the individual voltage producing cells 32 are defective. Although a conventional volt meter can be used to identify defective cells in the DC power source, since the voltage producing cells are often replaced in groups, the identification of the particular defective cell or cells can be unnecessary.

Figure 3:
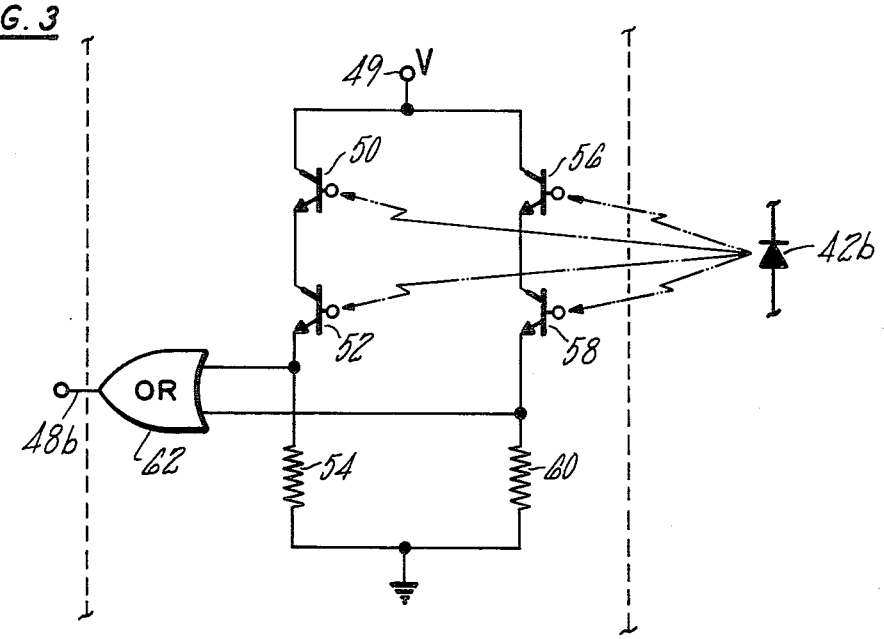
FIG. 3 is a schematic diagram of an alternative circuit configuration for one of the phototransistors of the photoresponsive device shown in FIG. 2.

Referring finally to FIG. 3, there is shown an embodiment for a circuit configuration to replace an individual phototransistor of the photoresponsive device shown in FIG. 2, but it is a circuit that demonstrates improved reliability over a single phototransistor. This is because the circuit effectively compensates for a single open circuit condition or a short circuit condition. As is seen, the circuit comprises a first leg connected to a terminal 49 which supplies a reference potential $V_c$ and includes a phototransistor 50 and 52, each having their emitter-collector paths connected in series with a resistor 54. An identical second leg is comprised of a phototransistor 56 and phototransistor 58, also having their emitter-collector paths connected in series coupled in series with resistor 60 and connected between terminal 49 and ground. An OR gate 62 has its input terminals connected to monitor the voltage in each leg. All of the phototransistors 50, 52, 56 and 58 are positioned to receive light from a single diode, such as LED 42b.

In the normal operation of this circuit, if an individual voltage producing cell goes negative then the corresponding LED 42 is rendered conductive and light impinges all of the phototransistors 50, 52, 56 and 58 simultaneously causing them to turn on. Since the OR gate 62 is rendered conductive by a signal at either input, the reference potential $V_c$ appears at its output indicating a fault condition in the DC power source 30. However, assume that phototransistor 50 is defective for some reason and does not switch to its conducting state in response to impinging light. This is an open circuit condition in the first leg but because both the phototransistors 56 and 58 respond normally and gate 62 is rendered conductive by the single signal applied to one of its inputs.

Finally, rather than the heretofore described open circuit condition in the first leg of the circuit configuration shown in FIG. 3, assume that phototransistor 50 is shorted so that its emitter-collector path will not change to its high impedance state. Because its emitter-collector path is in series with the emitter-collector path of the phototransistor 52, no voltage reaches the input of the OR gate 62 coupled to the first leg. But, a fault indication would appear at the output of the OR gate 62 when the phototransistors 56 and 58 were rendered conductive by light impinging thereon. Thus, it can be seen that the circuit of this embodiment will operate normally even if there is a short circuit or an open circuit condition in one of its legs or with one of the phototransistors of both legs short circuited.

Although the invention has been shown and described with respect to a preferred embodiment thereof, if should be understood by those skilled in the art that various changes and omissions in the form and detail thereof may be made without departing from the spirit and scope of the invention.

Having thus described typical embodiments of our invention, that which we claim as new and desire to secure by Letters Patent of the United States is:

1. A detector for sensing a faulty cell among a plurality of series connected voltage producing cells forming a source of DC electrical power, comprising:
    a plurality of light emitting diode means having an anode and a cathode which are capable of being biased to a conducting state by a positive anode-to-cathode voltage. and capable of being biased to a nonconducting state by a positive cathode-to-anode voltage, and
    means connecting each anode and cathode to the negative and positive junctions, respectively, of each of said plurality of voltage producing cells forming said source of DC electrical power thereby normally reverse biasing said light emitting diode means, whereby in the absence of a voltage output from any one of said voltage producing cells, the remaining voltage producing cells of said source of DC electrical power cause a positive anode-to-cathode voltage on that light emitting diode coupled to that one cell producing no voltage so that said light emitting diode means changes from its nonconducting state to its conducting state thereby emitting light.

2. A detector according to claim 1, further including a plurality of photoresponsive means, each positioned to receive light from one of said plurality of light emitting diode means, and wherein in response to received light each of said photoresponsive means provides an output signal indicating that the corresponding one of said cells is no longer producing an output voltage.

3. A detector according to claim 2, wherein each of said plurality of photoresponsive means is a phototransistor, and wherein each of said phototransistor has a source of reference potential coupled to its collector so that when enabled by light provided from one of said light emitting diode menas, the reference voltage level appears at its emitter.

4. A detector according to claim 1, further including a circuit configuration having a first leg, including photoresponsive means for receiving light from one of said plurality of light emitting diode, connected between a source of reference potential and ground, and a second leg, including photoresponsive means for receiving light from the same one of said plurality of light emitting diode means, also connected between said source of reference potential and ground, and wherein the enablement of said photoresponsive means in either said first leg or said second leg provides an output signal indicating that said cell corresponding to said one of said plurality of light emitting diode means is producing no voltage.

5. A detector according to claim 4, wherein said first leg includes a series connected pair of phototransistors positioned to receive light from one of said plurality of light emitting diode means, and wherein said second leg includes a series connected pair of phototransistors positioned to receive light from said same one of said plurality of said light emitting diode means, and wherein said circuit configuration includes an OR gate having one of its inputs connected to said first leg between said pair of series connected phototransistors and ground and its second input coupled to said second leg between said pair of series connected phototransistors and ground.

* * * * *